(12) United States Patent
Kim

(10) Patent No.: US 7,295,069 B2
(45) Date of Patent: Nov. 13, 2007

(54) DIFFERENTIAL AMPLIFIER CIRCUIT CAPABLE OF REDUCING CURRENT CONSUMPTION

(75) Inventor: Do-youn Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 44 days.

(21) Appl. No.: 11/265,701

(22) Filed: Nov. 2, 2005

(65) Prior Publication Data

US 2006/0103464 A1    May 18, 2006

(30) Foreign Application Priority Data

Nov. 5, 2004    (KR) ...................... 10-2004-0089696

(51) Int. Cl.
*H03F 3/45* (2006.01)
(52) U.S. Cl. ...................... 330/255; 330/261
(58) Field of Classification Search ................ 330/255, 330/253, 257, 261
See application file for complete search history.

(56) References Cited

U.S. PATENT DOCUMENTS 6,057,734 A * 5/2000 Xu .............................. 330/253
6,384,685 B1 * 5/2002 Juang .......................... 330/264
6,727,753 B2 * 4/2004 Moon .......................... 330/253

FOREIGN PATENT DOCUMENTS

| JP | 05-191162 | 7/1993 |
| JP | 2000-278058 | 10/2000 |
| JP | 2003-115729 | 4/2003 |
| JP | 2003-229725 | 8/2003 |

* cited by examiner

*Primary Examiner*—Henry Choe
(74) *Attorney, Agent, or Firm*—Myers Bigel Sibley & Sajovec PA

(57) ABSTRACT

An integrated circuit device includes a differential amplifier, an output driver and a control circuit. The differential amplifier is responsive to a pair of differential input signals and may include a pull-down current source responsive to a pair of bias signals. The output driver has a pull-up path and pull-down path therein. These paths are joined together at an output node. The output driver has a first input terminal electrically coupled to a first output terminal of the differential amplifier. The control circuit is electrically coupled to the differential amplifier and a second input terminal of the output driver. The control circuit is configured to dispose the pull-down path in a nonconductive state when the output node is being switched low-to-high.

17 Claims, 3 Drawing Sheets

DIFFERENTIAL AMPLIFIER CIRCUIT CAPABLE OF REDUCING CURRENT CONSUMPTION

REFERENCE TO PRIORITY APPLICATION

This application claims priority to Korean Application Serial No. 2004-89696, filed Nov. 5, 2004, the disclosure of which is hereby incorporated herein by reference.

FIELD OF THE INVENTION

The present invention relates to integrated circuit devices and, more particularly, to differential amplifier circuits.

BACKGROUND OF THE INVENTION

A push-pull amplifier circuit including CMOS (complementary metal oxide semiconductor) transistors is a general and often used circuit. An amplifier circuit, which may be used as an audio amplifier, is typically an analog amplifier circuit or a digital amplifier circuit. Analog amplifier circuits are generally realized using a class A amplifier circuit, a class B amplifier circuit or a class AB amplifier, and digital amplifier circuits are generally realized using a class D amplifier circuit. Since linearity of an audio amplifier circuit is considered more important than high efficiency, a linear amplifier, which is an analog amplifier, is generally used as the audio amplifier.

Class A, B and AB amplifier circuits are generally used as analog amplifier circuits because of their higher linearity. However, these classes of amplifiers use significant quantities of power when implemented as amplifiers for high output. Thus, analog amplifiers typically have the advantage of high linearity, but the disadvantage of low power efficiency. Specifically, in a class A analog amplifier, much more power is dissipated than the maximum output of the amplifier, and frequently the efficiency of the amplifier is not more than 25%. A class B push-pull amplifier, which is often used to overcome the efficiency problems of the class A amplifier, has two transistors coupled to each other in an emitter follower configuration. The class B push-pull amplifier is more efficient than the class A amplifier, but crossover distortion typically occurs in the class B push-pull amplifier when a signal level is low.

Furthermore, when the transistors included in the class B amplifier are alternately turned on and off, the transistors are easily turned on and off while small currents flow, but the transistors cannot be rapidly turned on and off while large currents flow. Therefore, since no bias current flows in the class B amplifier when the amplifier is in an idle state, it is difficult to rapidly turn the transistors on/off in a large current area and hence the total harmonic distortion (THD) is increased.

In the class AB amplifier, small currents flow when the amplifier is in a static state. These currents are much smaller than those of the class A amplifier but larger than those of the class B amplifier. As more bias current flows, the features of the class AB amplifier become more similar to those of the class A amplifier, and as less bias current flows, the features of class AB amplifiers become more similar to those of the class B amplifier.

FIG. 1 is a circuit diagram of a general differential amplifier circuit 100. FIG. 2 is a diagram that illustrates the relationship between a waveform of an output signal of the differential amplifier circuit of FIG. 1 and a pull-down transistor M6. Referring to FIG. 1, the differential amplifier circuit 100 includes a bias unit 110, a voltage control unit 120, a slew rate control unit 130, a differential amplifying unit 140, and an output unit 150. The differential amplifying unit 140 amplifies a voltage level difference between input signals PINS and NINS and outputs it through a first control node N1. The output unit 150 generates an output signal S_OUT through an output node NOUT in response to a voltage level of the first control node N1 and a voltage level of a second control node N2. When a voltage level of the input signal PINS is higher than that of the input signal NINS, the voltage level of the first control node N1 becomes low and a pull-up transistor M5 is turned on. When the pull-up transistor M5 is turned on, the output signal S_OUT rises from a low level to a high level.

Moreover, due to currents generated by a current source IB1 of the bias unit 110, transistors M7 and M8 of the voltage control unit 120 are turned on, and the voltage level of the second control node N2 remains constant at a level that maintains NMOS pull-down transistor M6 in a conductive state. Unfortunately, since the pull-down transistor M6 is kept in a conductive state while the output signal S_OUT rises from a low level to a high level, the current that flows through the pull-down transistor M6 is wasted.

A transistor M12 of the slew rate control unit 130 is in a turned-off state due to the voltage at the gates of current mirror transistors M3 and M4 of the differential amplifying unit 140. In addition, when the low level voltage of the first control node N1 is applied to a gate of a transistor M11, the transistor M11 is turned on. Then, a level of a gate of a transistor M13 becomes high, and the transistor M13 is kept in a turned-off state.

Alternatively, when the voltage level of the input signal NINS is higher than that of the input signal PINS, the voltage level of the first control node N1 is pulled high and the pull-up transistor M5 is turned off. When this occurs, the voltage level of the second control node N2 remains constant due to currents generated by the current source IB1 of the bias unit 110. A transistor M12 of the slew rate control unit 130 is in a turned-on state due to the voltage at the gates of the current mirror transistors M3 and M4. In addition, when a high level voltage of the first control node N1 is applied to the gate of the transistor M11, the transistor M11 is turned off. Then, when the level of the gate of the transistor M13 becomes low, the transistor is turned on, and a current IADD is applied to the second control node N2 through the transistors M12 and M13. When this occurs, the voltage level of the second control node N2 goes up, and the pull-down transistor M6 is turned on, and a logic level of the output signal S_OUT goes from high to low.

Because the gate voltage of the pull-down transistor M6 generally remains constant when the pull-down transistor M6 is turned on, the slew rate of the output signal S_OUT is reduced. Therefore, in the differential amplifier circuit 100 of FIG. 1, when the pull-down transistor M6 is turned on, an additional current IADD is applied to the second control node N2 to increase the voltage level of the second control node N2 such that the slew rate of the output signal S_OUT is improved. However, since the pull-down transistor M6 is kept turned on even when the pull-up transistor M5 is turned on and the output signal S_OUT is increased from a low level to a high level, the differential amplifier circuit 100 of FIG. 1 consumes significant power even during a stand-by power state. Accordingly, as illustrated by the timing diagram of FIG. 2, the pull-down transistor M6 remains conductive during low-to-high and high-to-low output switching and during stand-by. This conductive state during all three modes of operation increases the static and dynamic power of the amplifier circuit 100. Thus, as shown in FIG. 2, the pull-down transistor M6 is constantly turned on regardless of changes in the level of the output signal S_OUT, thus consuming an excessively large amount of current.

SUMMARY OF THE INVENTION

The present invention provides a differential amplifier circuit capable of reducing current consumption. According to an embodiment of the present invention, there is provided a differential amplifier circuit with a differential amplifying unit for amplifying a voltage difference between input signals and outputting the voltage difference through a first control node. An output unit outputs the amplified voltage difference as an output signal through an output node in response to an output of the first control node and an output of a second control node. A control unit controls a voltage level of the second control node in response to the output of the first control node, and causes an operating current to not flow to the output unit when a level of the output signal goes from a second level to a first level.

The first level may be a high level and the second level may be a low level. The output unit includes a pull-up transistor having a first terminal connected to a power source, a gate connected to the first control node and a second terminal connected to the output node, and a pull-down transistor having a first terminal connected to the output node, a gate connected to the second control node and a second terminal connected to a ground voltage. The voltage level of the second control node is kept low when the level of the output signal goes from the second level to the first level. The low voltage level of the second control node is enough to turn off the pull-down transistor.

The control unit includes a first control transistor having a first terminal connected to a power source, a gate connected to the first control node and a second terminal connected to a third control node. A first bias transistor and a second control transistor are also provided. The first bias transistor has a first terminal connected to the third control node, a gate connected to a first bias voltage and a second terminal connected to a ground voltage. The second control transistor has a first terminal connected to the power source and a gate connected to gates of current mirror transistors of the differential amplifying unit. A switch transistor is provided. The switch transistor has a first terminal connected to the second terminal of the second control transistor, a gate connected to the third control node and a second terminal connected to the second control node. A second bias transistor is also provided, which has a first terminal connected to the second control node, a gate connected to a second bias voltage and a second terminal connected to the ground voltage.

According to another embodiment of the present invention, there is provided a differential amplifier circuit including a differential amplifying unit, which amplifies a voltage difference between input signals and outputs the voltage difference through a first control node and an output unit, which outputs the amplified voltage difference as an output signal through an output node, in response to an output of the first control node and an output of a second control node. A control is also provided, which keeps a voltage level of the second control node low in response to the output of the first control node when a level of the output signal goes from a second level to a first level.

According to still another embodiment of the present invention, there is provided a differential amplifier circuit including an amplifying control unit for amplifying a voltage difference between input signals and outputting the voltage difference and an output unit, which includes a pull-up transistor controlled by a first control node and a pull-down transistor controlled by a second control node, for outputting an output signal through an output node. The amplifying control unit turns off the pull-down transistor when the output signal goes from a second level to a first level.

Still further embodiments of the invention include an integrated circuit device with a differential amplifier, an output driver and a control circuit therein. The differential amplifier is responsive to a pair of differential input signals. The differential amplifier may also include a pull-down current source responsive to a pair of bias signals. The output driver has a pull-up path and pull-down path therein. These paths are joined together at an output node (e.g., S_OUT). The output driver has a first input terminal electrically coupled to a first output terminal of the differential amplifier. The control circuit is electrically coupled to the differential amplifier and a second input terminal of the output driver. The control circuit is configured to dispose the pull-down path in a nonconductive state when the output node is being switched low-to-high. According to aspects of these embodiments, the first output terminal of the differential amplifier is fed back as an input to the control circuit and the control circuit is responsive to at least one of the pair of bias signals. In some of these embodiments, the pull-up path of the output driver may include a PMOS pull-up transistor having a gate terminal electrically connected to the first output terminal of the differential amplifier and the pull-down path of the output driver may include an NMOS pull-down transistor having a gate terminal electrically connected to an output terminal of the control circuit.

DETAILED DESCRIPTION OF THE INVENTION

Figure 1:
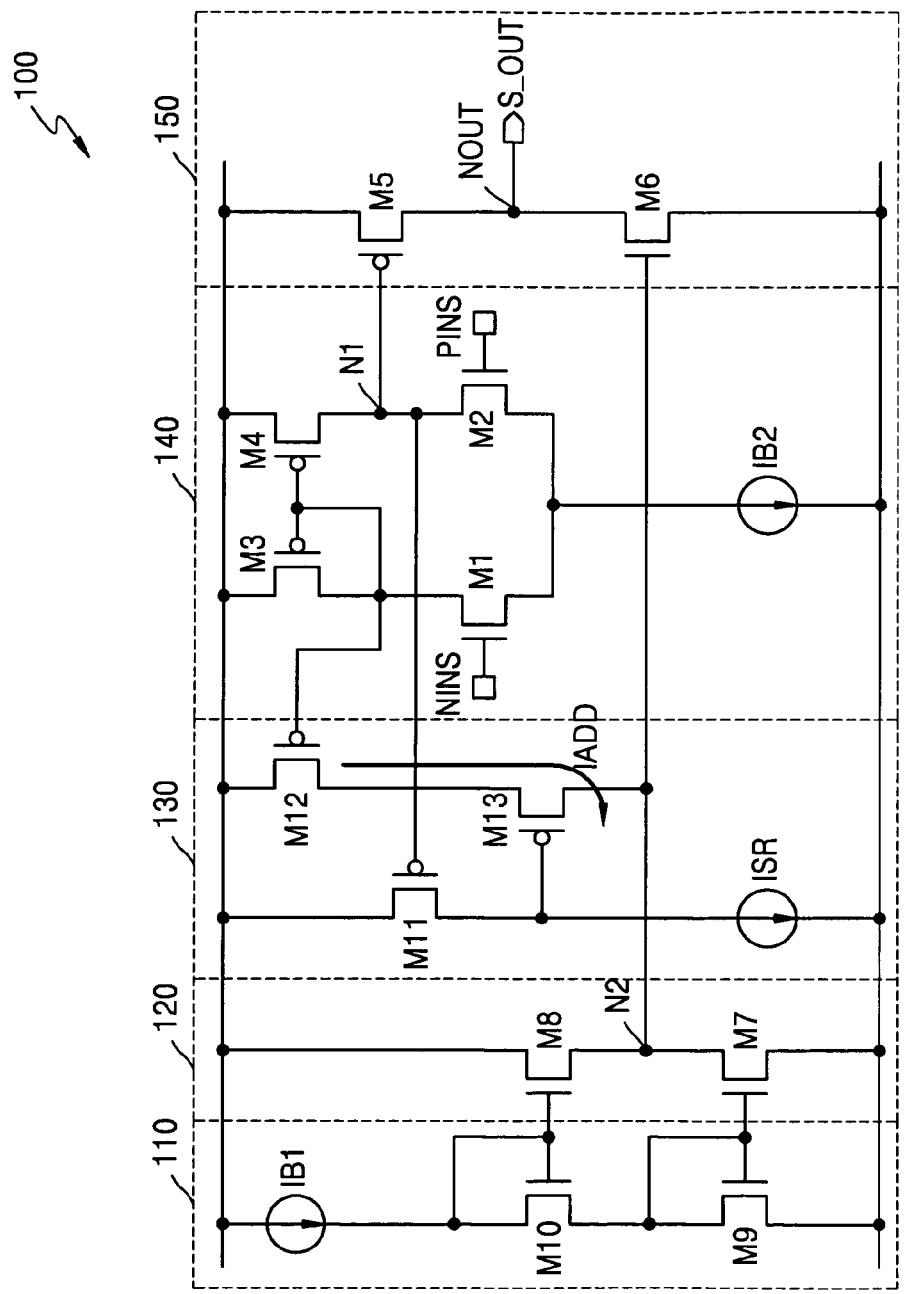
FIG. 1 is a circuit diagram of a conventional differential amplifier circuit.
Figure 2:
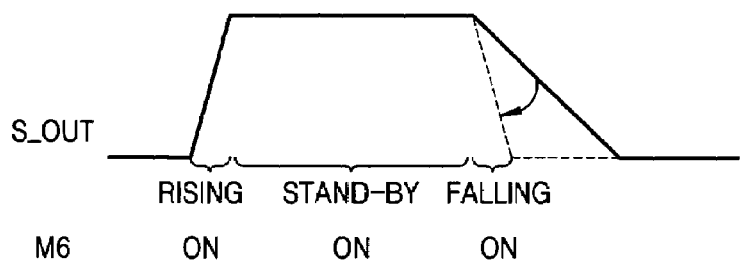
FIG. 2 is a diagram for explaining the relationship between a waveform of an output signal of the differential amplifier circuit and a pull-down transistor of FIG. 1.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 3:
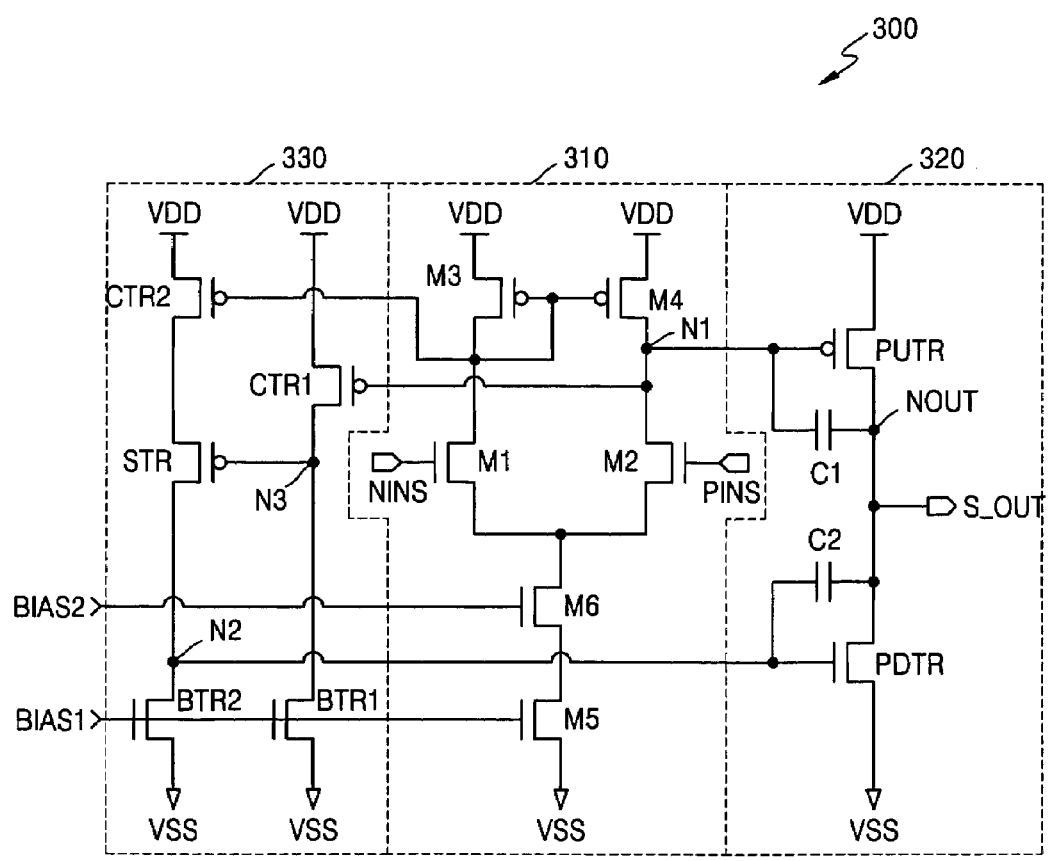
FIG. 3 is a circuit diagram of a differential amplifier circuit according to an embodiment of the present invention.
Figure 4:
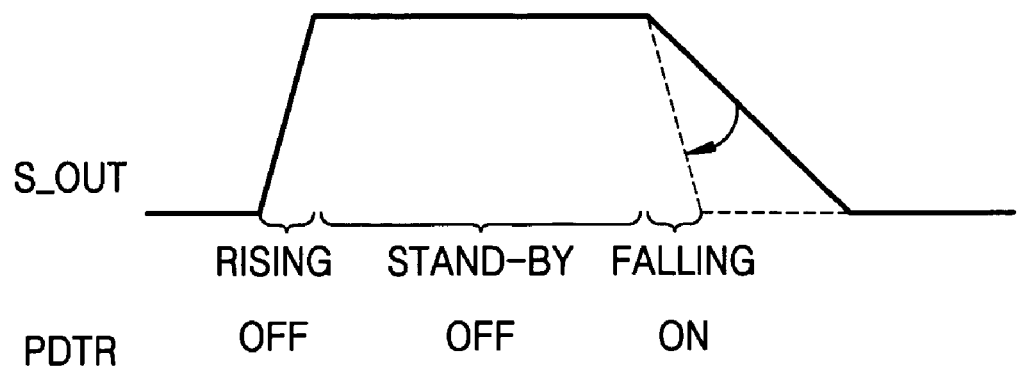
FIG. 4 is a diagram for explaining the relationship between a waveform of an output signal of the differential amplifier circuit and a pull-down transistor of FIG. 3.

FIG. 3 is a circuit diagram of a differential amplifier circuit 300 according to an embodiment of the present invention, and FIG. 4 is a diagram for explaining a relationship between a waveform of an output signal of the differential amplifier circuit 300 and a pull-down transistor PDTR of FIG. 3. Referring to FIG. 3, the differential amplifier circuit 300 includes a differential amplifying unit 310, an output unit 320, and a control unit 330. The differential amplifying unit 310 amplifies a voltage difference between input signals PINS and NINS, and outputs it through a first control node N1. The amplifying unit 310 includes a pair of NMOS input transistors M1 and M2, a pair of PMOS load transistors M3 and M4 and a current source defined by NMOS transistors M5 and M6.

The output unit 320 outputs an amplified voltage difference as an output signal S_OUT through an output node NOUT, in response to outputs of the first control node N1 and a second control node N2. More specifically, the output unit 320 includes a pull-up transistor PUTR and a pull-down transistor PDTR. The pull-up transistor PUTR has a first terminal connected to a power source VDD, a gate connected to the first control node N1, and a second terminal connected to the output node NOUT. The pull-down transistor PDTR has a first terminal connected to the output node NOUT, a gate connected to the second control node N2, and a second terminal connected to a ground voltage VSS.

The control unit 330 controls a voltage level of the second control node N2 in response to the output of the first control node N1, so that an operating current does not flow through the output unit 320 when the level of the output signal S_OUT goes from a second level to a first level. In the illustrated embodiment, the first level is a high level, and the second level is a low level. More specifically, the control unit 330 includes a first control transistor CTR1, a second control transistor CTR2, a first bias transistor BTR1, a second bias transistor BTR2, and a switch transistor STR. The first control transistor CTR1 has a first terminal connected to the power source voltage VDD, a gate connected to the first control node N1, and a second terminal connected to a third control node N3. The first bias transistor BTR1 has a first terminal connected to the third control node N3, a gate connected to a first bias voltage BIAS1, and a second terminal connected to the ground voltage VSS. The second control transistor CTR2 has a first terminal connected to the power source voltage VDD and a gate connected to gates of current mirror transistors M3 and M4 in the differential amplifying unit 310. The switch transistor STR has a first terminal connected to a second terminal of the second control transistor CTR2, a gate connected to the third control node N3, and a second terminal connected to the second control node N2. The second bias transistor BTR2 has a first terminal connected to the second control node N2, a gate connected to a second bias voltage BIAS2, and a second terminal connected to the ground voltage VSS.

When the first and second bias voltages BIAS 1 and BIAS2 are applied to transistors M5 and M6, the transistors M5 and M6 are turned on and the differential amplifying unit 310 operates. When the voltage level of the input signal PINS is higher than that of the input signal NINS, since a transistor M2 of the differential amplifying unit 310 is turned on such that more current flows through M2 than through a transistor M1, the voltage level of the first control node N1 goes down and the pull-up transistor PUTR is turned on. Then, the output signal S_OUT at a high level is output through the output node NOUT.

When the first and second bias voltages BIAS1 and BIAS2 are respectively applied to the first and second bias transistors BTR1 and BTR2, the first and second transistors BTR1 and BTR2 are turned on and the control unit 330 operates. Since the level of the first control node N1 is low, the first control transistor CTR1 of the control unit 330 is turned on and the voltage level of the third control node N3 goes high. The second control transistor CTR2 is kept in a turned-off state by a gate voltage of the load transistors M3 and M4 of the differential amplifying unit 310.

Then, the switch transistor STR is turned off by a high level voltage of the third control node N3, and the level of the second control node N2 goes low because the second bias transistor BTR2 remains turned-on. Since the voltage level of the second control node N2 is low, the pull-down transistor PDTR of the output unit 320 is turned off. Due to the low voltage level of the second control node N2, the pull down transistor PDTR can be sufficiently turned off to thereby reduce overall power consumption. In the differential amplifier circuit 300 of FIG. 3, unlike the differential amplifier circuit 100 of FIG. 1, when the level of the output signal S_OUT goes from a low level to a high level, the voltage level of the second control node N2 remains low. Therefore, the pull-down transistor PDTR is turned off.

Accordingly, during an output signal S_OUT rising period in which the output signal S_OUT is switched from a low level to a high level, current can be prevented from flowing through the pull-down transistor PDTR and current consumption can be reduced. When the voltage level of the input signal PINS is less than that of the input signal NINS, since the transistor M1 of the differential amplifying unit 310 is turned on such that more current flows through M1 than through the transistor M2, the level of the first control node N1 becomes high and the pull-up transistor PUTR is turned-off. If the level of the first control node N1 is high, the first control transistor CTR1 of the control unit 330 is turned off. Then, because the first bias transistor BTR1 is in a turned-on state, the level of the third control node N3 becomes low. The switch transistor STR is thereby turned on by the low level voltage of the third control node N3, and the level of the second control node N2 becomes high since the second control transistor CTR2 and the switch transistor STR are in a turned-on state. In response, the pull-down transistor PDTR of the output unit 320 is turned on because the level of the second control node N2 is high, and the output signal S_OUT is transferred from a high level to a low level. At this point, since the voltage level of the second control node N2 can be raised to a power source level by the power source VDD connected through the second control transistor CTR2 and the switch transistor STR, the pull-down transistor PDTR is turned on such that a maximum current can flow therethrough and thus the output signal S_OUT is rapidly switched from a high level to a low level, as shown in FIG. 4. This rapid switching results in improved slew rate.

The output unit 320 of the differential amplifier circuit 300 of FIG. 3 can include compensating capacitors C1 and C2 between the output node NOUT and the first control node N1 and between the output node NOUT and the second control node N2, respectively. Moreover, the differential amplifier circuit 300 of FIG. 3 may be installed in a driver circuit of a liquid crystal display device, and thus, the operating current consumption and static current consumption of the driver circuit can be reduced. Also, since the differential amplifier circuit 300 of the FIG. 3 includes a small number of elements (transistors), the circuit size of the driver circuit can be decreased.

A differential amplifier circuit according to another exemplary embodiment of the present invention includes a differential amplifying unit, an output unit, and a control unit. The differential amplifying unit amplifies a voltage difference between the input signals and outputs it through a first control node. The output unit outputs the amplified voltage difference as an output signal to an output node in response to an output of the first control node and an output of a second control node. The control node keeps a voltage level of the second control node low in response to the output of the first control node when a level of the output signal goes from a second level to a first level. Due to the low voltage level of the second control node N2, a pull down transistor can be sufficiently turned off.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit device, comprising:
    a differential amplifier responsive to a pair of differential input signals;
    an output driver having a pull-up path and pull-down path therein that are joined together at an output node and a first input terminal electrically coupled to a first output terminal of said differential amplifier; and
    a control circuit electrically coupled to said differential amplifier and a second input terminal of said output driver, said control circuit configured to dispose the pull-down path in a nonconductive state when the output node is being switched low-to-high;
    wherein the first output terminal of said differential amplifier is fed back as an input to said control circuit; and
    wherein said differential amplifier comprises a pull-down current source responsive to a pair of bias signals.

2. The integrated circuit device of claim 1, wherein said control circuit is responsive to at least one of the pair of bias signals.

3. The integrated circuit device of claim 1, wherein the pull-up path of said output driver comprises a PMOS pull-up transistor having a gate terminal electrically connected to the first output terminal of said differential amplifier; and wherein the pull-down path of said output driver comprises an NMOS pull-down transistor having a gate terminal electrically connected to an output terminal of said control circuit.

4. The integrated circuit device of claim 3, wherein said control circuit is configured to pull down the output terminal in response to a turn-on of the PMOS pull-up transistor.

5. The integrated circuit device of claim 4, wherein said control circuit has an input terminal electrically connected to a gate terminal of the PMOS pull-up transistor.

6. An integrated circuit device, comprising:
    a differential amplifier responsive to a pair of differential input signals, said differential amplifier comprising a pull-down current source responsive to a pair of bias signals;
    an output driver having a pull-up path and pull-down path therein that are joined together at an output node and a first input terminal electrically coupled to a first output terminal of said differential amplifier; and
    a control circuit electrically coupled to said differential amplifier and a second input terminal of said output driver, said control circuit configured to dispose the pull-down path in a nonconductive state when the output node is being switched low-to-high;
    wherein the pull-up path of said output driver comprises a PMOS pull-up transistor having a gate terminal electrically connected to the first output terminal of said differential amplifier; and wherein the pull-down path of said output driver comprises an NMOS pull-down transistor having a gate terminal electrically connected to an output terminal of said control circuit; wherein said control circuit is configured to pull down the output terminal in response to a turn-on of the PMOS pull-up transistor; and wherein said control circuit has an input terminal electrically connected to a gate terminal of the PMOS pull-up transistor.

7. The integrated circuit device of claim 6, wherein said control circuit is responsive to at least one of the pair of bias signals.

8. A differential amplifier circuit comprising:
    a differential amplifying unit amplifying a voltage difference between input signals and outputting the voltage difference through a first control node;
    an output unit outputting the amplified voltage difference as an output signal through an output node in response to an output of the first control node and an output of a second control node; and
    a control unit keeping a voltage level of the second control node low in response to the output of the first control node when a level of the output signal goes from a second level to a first level;
    wherein the control unit includes;
        a first control transistor having a first terminal connected to a power source, a gate connected to the first control node and a second terminal connected to a third control node;
        a first bias transistor having a first terminal connected to the third control node, a gate connected to a first bias voltage and a second terminal connected to a ground voltage;
        a second control transistor having a first terminal connected to the power source and a gate connected to gates of current mirror transistors of the differential amplifying unit;
        a switch transistor having a first terminal connected to the second terminal of the second control transistor, a gate connected to the third control node and a second terminal connected to the second control node; and
        a second bias transistor having a first terminal connected to the second control node, a gate connected to the second bias voltage and a second terminal connected to the ground voltage.

9. The differential amplifier circuit of claim 8, wherein the output unit includes:
    a pull-up transistor having a first terminal connected to a power source, a gate connected to the first control node and a second terminal connected to the output node; and
    a pull-down transistor having a first terminal connected to the output node, a gate connected to the second control node and a second terminal connected to a ground voltage.

10. The differential amplifier circuit of claim 9, wherein the low voltage level of the second control node is enough to turn off the pull-down transistor.

11. The differential amplifier circuit of claim 8, wherein the first level is a high level and a second level is a low level.

12. A differential amplifier circuit comprising:
a differential amplifying unit amplifying a voltage difference between input signals and outputting the voltage difference through a first control node;
an output unit outputting the amplified voltage difference as an output signal through an output node in response to an output of the first control node and an output of a second control node; and
a control unit keeping a voltage level of the second control node low in response to the output of the first control node when a level of the output signal goes from a second level to a first level;
wherein the output unit includes compensating capacitors which are connected between the output node and the first control node and between the output node and the second control node, respectively.

13. A differential amplifier circuit comprising:
an amplifying control unit amplifying a voltage difference between input signals and outputting the voltage difference; and
an output unit including a pull-up transistor controlled by a first control node and a pull-down transistor controlled by a second control node and outputting an output signal through an output node,
wherein the amplifying control unit turns off the pull-down transistor when the output signal goes from a second level to a first level;
wherein the output unit includes compensating capacitors which are connected between the output node and the first control node and between the output node and the second control node, respectively.

14. The differential amplifier circuit of claim 13, wherein the amplifying control unit keeps a level of the second control node low when the output signal goes from a second level to a first level.

15. The differential amplifier circuit of claim 14, wherein the low voltage level of the second node is enough to turn off the pull-down transistor.

16. The differential amplifier circuit of claim 13, wherein the first level is a high level and the second level is a low level.

17. A differential amplifier circuit comprising:
an amplifying control unit amplifying a voltage difference between input signals and outputting the voltage difference; and
an output unit including a pull-un transistor controlled by a first control node and a pull-down transistor controlled by a second control node and outputting an output signal through an output node,
wherein the amplifying control unit turns off the pull-down transistor when the output signal goes from a second level to a first level;
wherein the amplifying control unit includes:
a differential amplifying unit amplifying a voltage difference between input signals and outputting the voltage difference through the first control node;
a first control transistor having a first terminal connected to a power source, a gate connected to the first control node and a second terminal connected to a third control node;
a first bias transistor having a first terminal connected to the third control node, a gate connected to a first bias voltage and a second terminal connected to a ground voltage;
a second control transistor having a first terminal connected to the power source and a gate connected to gates of current mirror transistors of the differential amplifying unit;
a switch transistor having a first terminal connected to the second terminal of the second control transistor, a gate connected to the third control node and a second terminal connected to the second control node; and
a second bias transistor having a first terminal connected to the second control node, a gate connected to the second bias voltage and a second terminal connected to the ground source.

* * * * *

UNITED STATES PATENT AND TRADEMARK OFFICE
CERTIFICATE OF CORRECTION

| | |
|---|---|
| PATENT NO. | : 7,295,069 B2 |
| APPLICATION NO. | : 11/265701 |
| DATED | : November 13, 2007 |
| INVENTOR(S) | : Kim |

It is certified that error appears in the above-identified patent and that said Letters Patent is hereby corrected as shown below:

Column 10, Claim 17, Line 6: Please correct "pull-un"
  To read -- pull-up --

Signed and Sealed this

Thirty-first Day of March, 2009

JOHN DOLL
*Acting Director of the United States Patent and Trademark Office*